(12) United States Patent
Sievers et al.

(10) Patent No.: US 6,490,171 B2
(45) Date of Patent: Dec. 3, 2002

(54) APPARATUS FOR SHIELDING

(75) Inventors: Christopher Sievers, Hanau (DE); Reinhold Berberich, Frankfurt (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 09/921,440

(22) Filed: Aug. 2, 2001

(65) Prior Publication Data

US 2002/0054485 A1 May 9, 2002

(30) Foreign Application Priority Data

Aug. 17, 2000 (DE) ........................................ 100 40 215

(51) Int. Cl.⁷ ................................................ H05K 7/14
(52) U.S. Cl. ........................ 361/800; 361/816; 361/818; 174/51
(58) Field of Search ................................. 361/800, 816, 361/818, 752, 799, 814; 174/35 R, 35 C, 51; 248/633–638; 439/76.2

(56) References Cited

FOREIGN PATENT DOCUMENTS

DE          4321719          10/1994

*Primary Examiner*—David Martin
*Assistant Examiner*—Thanh S. Phan
(74) *Attorney, Agent, or Firm*—Martin A. Farber

(57) ABSTRACT

An invention relates to an apparatus for shielding an electronic circuit situated on a printed circuit board in an electrically conductive housing which has at least one opening and/or bushing, in which a shielding tube extends from the printed circuit board as far as the housing and encompasses the opening and/or the bushing, and a device for length equalization of the shielding tube forms an electrical contact of the shielding tube independently of tolerances between the printed circuited board and the housing.

9 Claims, 2 Drawing Sheets

APPARATUS FOR SHIELDING

FIELD AND BACKGROUND OF THE INVENTION

The invention relates to an apparatus for shielding an electronic circuit situated on a printed circuit board in an electrically conductive housing which has at least one opening and/or bushing.

In electronic equipment, interference and faults can occur on account of electromagnetic radiation from external sources. Particular weak points in this case are the bushings of connection pins through the electrically conductive housing surrounding the electronic circuit, and also the connection pins themselves.

SUMMARY OF THE INVENTION

It is an object of the present invention, therefore, to improve the shielding in the region of openings and bushings of the housing.

This object is achieved according to the invention by virtue of the fact that a shielding tube extends from the printed circuit board as far as the housing and encompasses the opening and/or the bushing, and that a device for length equalization of the shielding tube forms an electrical contact of the shielding tube independently of tolerances between the printed circuit board and the housing.

The apparatus according to the invention has the advantage that the region around the opening and/or bushing and around the connection pins is completely shielded from the circuit. Furthermore, the shielding is effected independently of the actual distance between printed circuit board and housing within given tolerances. The invention can be applied to all metallic and metallized housings.

A first advantageous refinement of the invention consists in the fact that the device for length equalization is formed by the shielding tube being resilient in the longitudinal direction. In this case, the shielding tube can be dimensioned in such a way that, for all distances manifested between the housing and the printed circuit board, it exerts a pressure which is required for reliable contact with the housing. Preferably, at least part of the shielding tube is in bellows form.

Further advantageous refinements of the invention consist in the fact that the device for length equalization is formed by a peripheral web arranged on the housing, the shielding tube engaging into said web or which web is encompassed by the shielding tube.

For the purpose of reliable contact-making and reliable sealing, in these refinements it may be provided that the shielding tube is provided with a flange, which serves as contact area and is directed toward the peripheral web.

A contribution to inexpensive production of the apparatus according to the invention is made by the fact that the peripheral web is connected in one piece to the housing. In the invention, however, it may also be provided that the peripheral web is part of a plug apparatus.

BRIEF DESCRIPTION OF THE DRAWINGS

The invention permits numerous embodiments. A number of these embodiments are diagrammatically illustrated in the drawing using a number of figures as bed below. In the figures.

DETAILED DESCRIPTION OF THE PREFERRED EMBODIMENT

Identical parts are provided with identical reference symbols in the figures.

Figure 1:
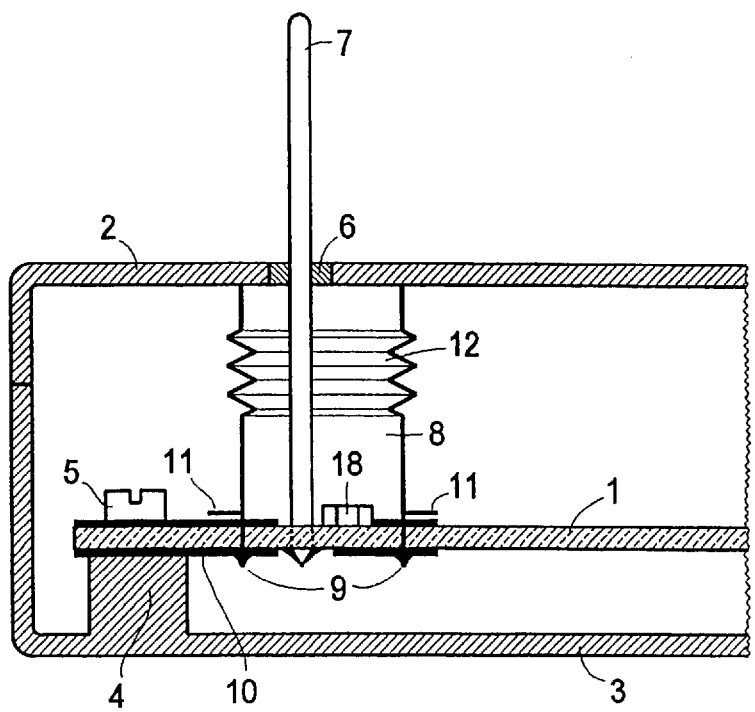
FIG. 1 shows an exemplary embodiment with a shielding tube according to the invention, which tube is designed partly in bellows form.

FIG. 1 illustrates an exemplary embodiment according to the invention for shielding an electronic circuit situated on a printed circuit board 1. Said electronic circuit is situated in a housing made of metal, comprising a housing upper part 2 and a housing lower part 3. Of the means for fixing the printed circuit board 1, a base 4 and a fixing screw 5 are illustrated. An insulated bushing 6 enables the bushing of the connection pin 7, which is soldered into the printed circuit board, through the housing. The connection pin 7 is connected to an interference-suppression capacitor 18 and to the circuit (not illustrated in detail). Within the housing, the connection pin 7 is surrounded by the shielding tube 8. The latter is provided with soldering pins 9 and is plugged onto the printed circuit board 1 and soldered to the ground conductor track 10. Moreover, contact areas 11 are provided as a further possibility for fixing the shielding tube on the printed circuit board. In this exemplary embodiment, the upper part 12 of the resilient shielding tube 8 is designed in bellows form. In addition, an interference-suppression capacitor 13 is fitted on the printed circuit board surface.

Figure 2:
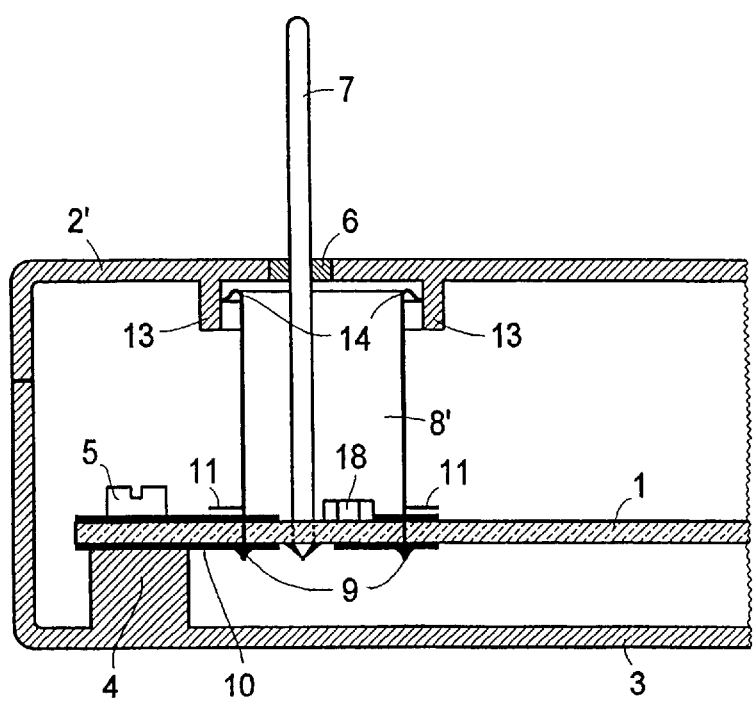
FIG. 2 shows an exemplary embodiment with a shielding tube according to the invention, which tube engages in a peripheral web arranged on the housing.

FIG. 2 shows an exemplary embodiment which, in the same way as that according to FIG. 1, comprises a housing and a printed circuit board 1 fixed therein. A connection pin 7 fixed on the printed circuit board 1 also penetrates through the housing upper part 2'. In this exemplary embodiment, however, a peripheral web 13 is arranged on the housing upper part 2'. This peripheral web 13 encompasses the shielding tube 8', whose upper edge has an outwardly pointing flange 14.

Figure 3:
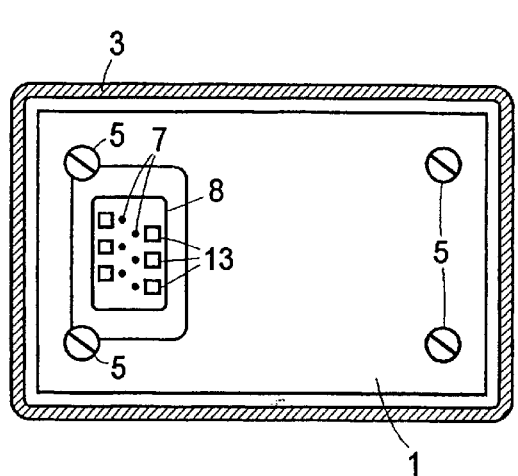
FIG. 3 shows a plan view of an exemplary embodiment according to the invention.

FIG. 3 shows a plan view through a further exemplary embodiment with housing cut away. Six connection pins 7 with an interference-suppression capacitor 18 in each case are provided here.

Figure 4:
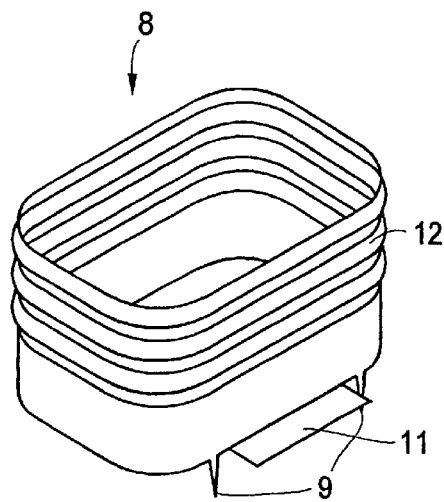
FIG. 4 shows a perspective illustration of a shielding tube.

FIG. 4 shows a perspective illustration of a shielding tube 8 according to the invention, which tube is used in the exemplary embodiment described in FIG. 1. The upper part 12 of the shielding tube 8 is designed in bellows form. Located on the lower edge of the shielding tube 8 are soldering pins 9 and contact areas 11 for fixing on the printed circuit board.

Figure 5:
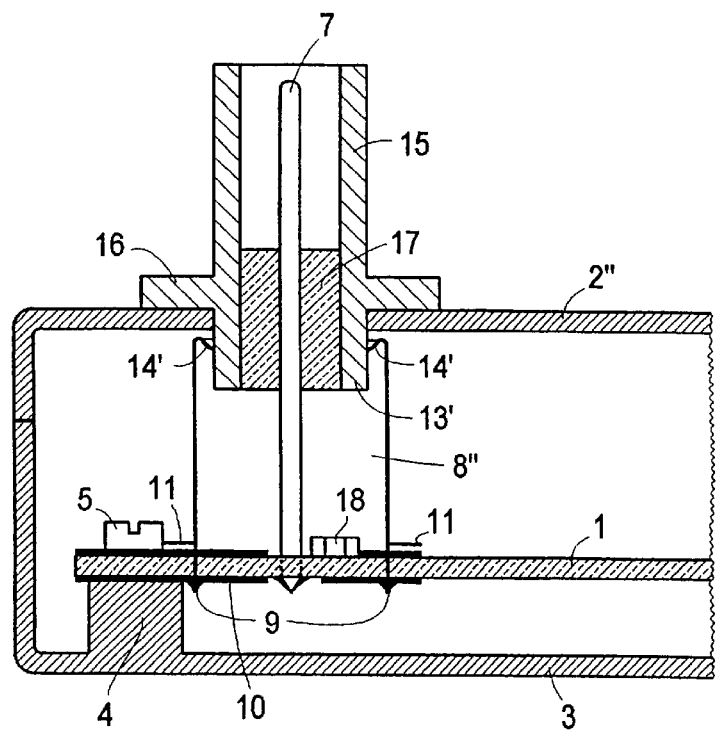
FIG. 5 shows an exemplary embodiment with a shielding tube according to the invention, which tube encompasses a peripheral web arranged on the housing.

FIG. 5 shows an exemplary embodiment which likewise comprises a housing upper part 2", a housing lower part 3 and a printed circuit board 1 fixed thereon. The bushing through the housing upper part 2" is designed as a plug apparatus 15. In addition to the part that actually projects to the outside, the housing of the plug apparatus comprises a fixing flange 16 and the peripheral web 13' projecting into the interior of the housing. An insulation 17 centers the connection pin 7. The shielding tube 8" is designed in such a way that the upper edge, as flange 14, encompasses the peripheral web 13'.

We claim:

1. An apparatus for shielding an electronic circuit situated on a printed circuit board in an electrically conductive housing which has at least one of an opening and bushing, the apparatus comprising a shielding tube (8, 8', 8") extending from the printed circuit board (1) to the housing (2, 2', 2", 3) and encompassing the at least one of the opening and bushing (6), said shielding tube having an adjustable length and including an electrical contact for electrically connecting said shielding tube to said printed circuit board independently of tolerances between the printed circuit board (1) and the housing (2, 2', 2", 3).

2. The apparatus as claimed in claim 1, wherein the adjustable length of the shielding tube (8) is resilient in a longitudinal direction between the printed circuit board and the housing.

3. The apparatus as claimed in claim 2, wherein at least part of the shielding tube (8) is in bellows form.

4. The apparatus as claimed in claim 1, wherein the housing includes a peripheral web (13) the shielding tube (8") engaging said peripheral web.

5. The apparatus as claimed in claim 4, wherein the shielding tube (8', 8") is provided with a flange (14, 14'), which serves as a contact area and is directed toward the peripheral web (13, 13').

6. (new) The apparatus as claimed in claim 4, wherein the peripheral web (13, 13') is connected in one piece to the housing (2').

7. The apparatus as claimed in claim 4, wherein the peripheral web (13') is part of a plug apparatus (15).

8. The apparatus as claimed in claim 1, wherein the housing includes a peripheral web (13') said web being encompassed by the shielding tube (8").

9. The apparatus as claimed in claim 8, wherein the peripheral web (13') is part of a plug apparatus (15).

* * * * *